(12) United States Patent
Ren

(10) Patent No.: US 9,685,595 B1
(45) Date of Patent: Jun. 20, 2017

(54) LIGHT-EMITTING DIODE CHIP PACKAGES AND METHODS FOR MANUFACTURE THEREOF

(71) Applicant: SHUNSIN TECHNOLOGY (ZHONG SHAN) LIMITED, Zhongshan (CN)

(72) Inventor: Fei Ren, Shenzhen (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 0 days.

(21) Appl. No.: 15/166,220

(22) Filed: May 26, 2016

(30) Foreign Application Priority Data

Nov. 30, 2015 (CN) .......................... 2015 1 0867973

(51) Int. Cl.
    *H01L 33/50* (2010.01)
    *H01L 33/06* (2010.01)
    *H01L 33/32* (2010.01)
    *H01L 33/00* (2010.01)
    *H01L 33/56* (2010.01)
    *H01L 33/62* (2010.01)
    *H01L 33/60* (2010.01)

(52) U.S. Cl.
    CPC .......... *H01L 33/502* (2013.01); *H01L 33/007* (2013.01); *H01L 33/0095* (2013.01); *H01L 33/06* (2013.01); *H01L 33/32* (2013.01); *H01L 33/56* (2013.01); *H01L 33/60* (2013.01); *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
    CPC ..................................................... H01L 33/502
    See application file for complete search history.

(56) References Cited

U.S. PATENT DOCUMENTS

| | | | | |
|---|---|---|---|---|
| 5,702,982 A * | 12/1997 | Lee | ................... | H01L 21/76808 257/E21.579 |
| 6,876,008 B2 * | 4/2005 | Bhat et al. | .............. | H01L 33/62 257/84 |
| 7,084,435 B2 * | 8/2006 | Sugimoto et al. | ........ | F21K 9/00 257/100 |
| 2004/0066133 A1 * | 4/2004 | Takeuchi | ................ | H01J 1/316 313/495 |
| 2004/0222433 A1 * | 11/2004 | Mazzochette et al. | ................... | H01L 25/0753 257/99 |
| 2005/0156184 A1 * | 7/2005 | Shen | ....................... | H01L 33/46 257/98 |
| 2007/0269621 A1 * | 11/2007 | Mitsuhashi et al. | ................... | H01L 27/3246 428/34.1 |
| 2008/0087908 A1 * | 4/2008 | Krauter | ................... | G02B 1/105 257/98 |

(Continued)

*Primary Examiner* — Scott B Geyer
*Assistant Examiner* — S. M. S Imtiaz
(74) *Attorney, Agent, or Firm* — Steven Reiss

(57) ABSTRACT

A light-emitting diode chip package and a manufacturing process thereof sequentially includes a transparent layer, a fluorescent layer, a wafer layer, a light-emitting diode chip, a dielectric layer, a metal circuit layer, and a protective film and conductive blocks used to draw out the electrodes of the light-emitting diode chip. The outer surfaces of the fluorescent layer and the wafer layer retreat from the fluorescent layer down to the wafer layer to form a slant, and the dielectric layer, the metal circuit layer, and the protective film spread out to coat the slant. Simple techniques at low cost are involved.

9 Claims, 5 Drawing Sheets

(56) References Cited

U.S. PATENT DOCUMENTS

| | | | |
|---|---|---|---|
| 2009/0134483 A1* | 5/2009 | Weng et al. | H01L 27/1462 257/432 |
| 2009/0309209 A1* | 12/2009 | Chen | H01L 21/568 257/690 |
| 2012/0187862 A1* | 7/2012 | Britt et al. | H01L 33/62 315/291 |
| 2012/0256215 A1* | 10/2012 | Liou et al. | H01L 33/58 257/98 |
| 2013/0048945 A1* | 2/2013 | Fang et al. | H01L 33/20 257/13 |
| 2014/0103499 A1* | 4/2014 | Andry et al. | H01L 21/6835 257/644 |
| 2015/0069435 A1* | 3/2015 | Chen | H01L 33/56 257/98 |
| 2015/0144871 A1* | 5/2015 | Miller et al. | H01L 33/06 257/13 |
| 2016/0097496 A1* | 4/2016 | Allen et al. | H01L 33/44 257/40 |
| 2016/0118565 A1* | 4/2016 | Lin et al. | H01L 33/52 257/99 |
| 2016/0308101 A1* | 10/2016 | Konishi et al. | H01L 33/62 |

* cited by examiner

LIGHT-EMITTING DIODE CHIP PACKAGES AND METHODS FOR MANUFACTURE THEREOF

FIELD

The subject matter herein generally relates to the field of chip packages, and particularly to light-emitting diode chip packages and methods for manufacturing light-emitting diode chip packages.

BACKGROUND

As shown in FIG. 1, a conventional white light-emitting diode (LED) chip package formed by a blue LED and a phosphor layer includes an LED chip 3 and a substrate 5. The LED chip 3 is soldered on the substrate 5 via a convex element 6. A light-emitting surface of the LED chip 3 is coated with a phosphor layer 2 and then sealed with a silicone lens 1, gaps between the LED chip 3 and the substrate 5 being filled with filler 4. A number of processes are involved in manufacturing the white LED chip package, including preparing a substrate 5, manufacturing a convex element 6, soldering an LED chip 3 to the substrate 5 with the convex element 6, coating a phosphor layer 2 to the LED chip 3, and formation of silicone lens 1 and others. On account of the complex manufacturing process, the investment cost for the manufacturing equipment is high, meanwhile the white LED chip package takes up much more real estate on a printed circuit board than the LED chip 3.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
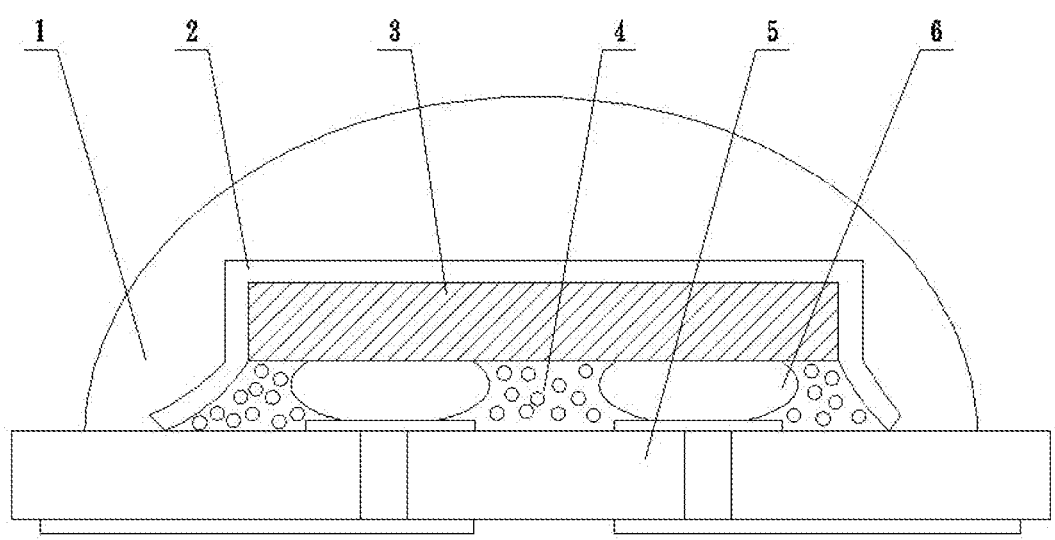
FIG. 1 is a view illustrating a conventional white LED chip package.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising" when utilized, means "including, but not necessarily limited to"; it specifically indicates open-ended inclusion or membership in the so-described combination, group, series and the like.

Figure 2:
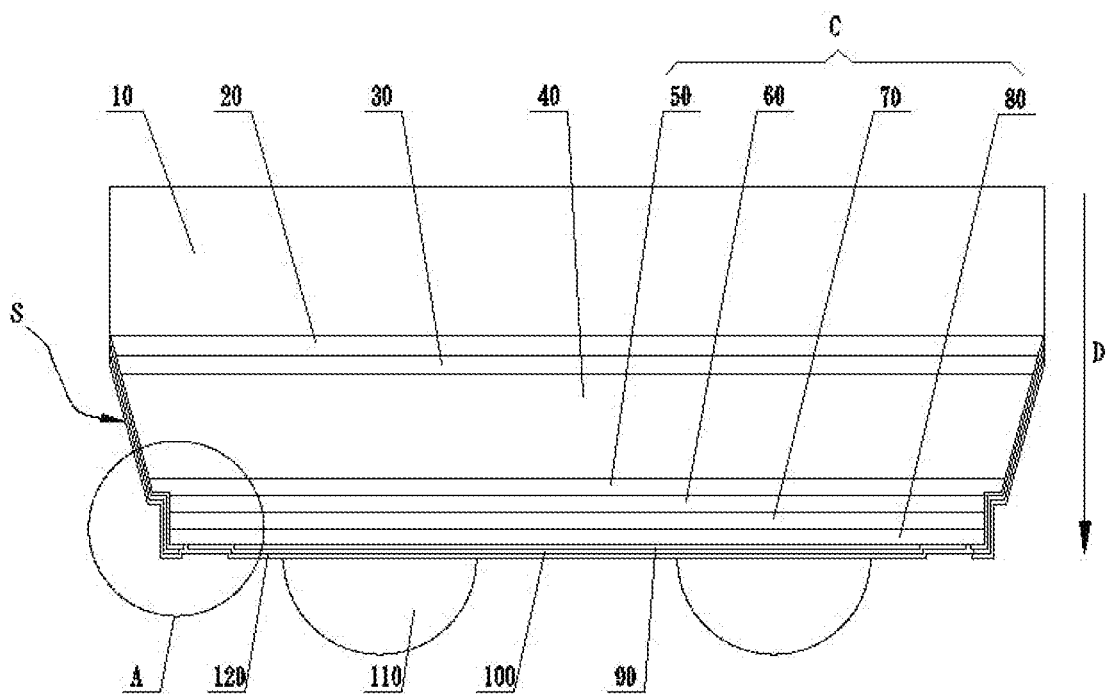
FIG. 2 is a schematic view of a light-emitting diode chip package of the disclosure.
Figure 3:
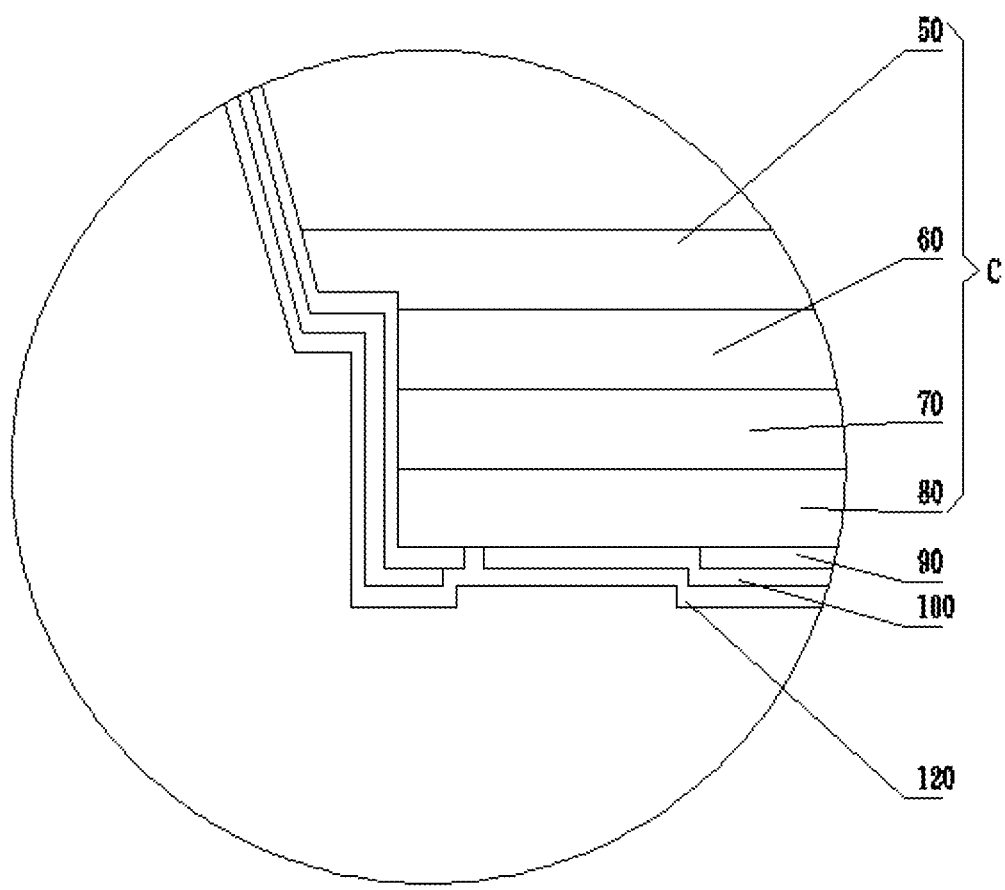
FIG. 3 is a partially enlarged view of portion A of the light-emitting diode chip package in FIG. 2.

As shown in FIG. 2 and FIG. 3, a light-emitting diode chip package provided in an embodiment of the disclosure sequentially includes a transparent layer 10, a fluorescent layer 20, a bonding layer 30, a wafer layer 40, a light-emitting diode chip C, a dielectric layer 90, a metal circuit layer 100, a protective film 120, and a plurality of conductive blocks 110 along a predetermined direction. The conductive blocks 110 are used to draw out the electrodes of the light-emitting diode chip C and to assemble pins thereto. Outer surfaces of the fluorescent layer 20, the bonding layer 30, and the wafer layer 40 are shrunk from the fluorescent layer 20 to the wafer layer 40 and form a slant S. The dielectric layer 90, the metal circuit layer 100, and the protective film 120 are extended to cover the slant S. To facilitate understanding, the predetermined direction is shown as direction D in FIG. 2, and in this case, the light-emitting diode chip C is a GaN-based light-emitting diode chip sequentially formed by a GaN layer 50, an n-type GaN layer 60, a quantum layer 70, and a p-type GaN layer 80 along the direction D, and the GaN layer 50 is adjacent the n-type GaN layer 60. The light-emitting diode chip C is provided with gaps corresponding to the conductive blocks 110. The dielectric layer 90, the metal circuit layer 100, and the protective film 120 respectively define openings corresponding to the gaps to expose the conductive blocks 110, to achieve electrical connection to external components via the conductive blocks 110. The light-emitting diode chip C can be chosen from numerous and various structures similar to those described above.

In the embodiment of the disclosure, the transparent layer 10 is used as a supporting and light-transmitting unit. The monochromatic light emitted from the light-emitting diode chip C can be converted into white light after passing through the fluorescent layer 20 due to the mechanism of fluorescence. The dielectric layer 90 is provided to prevent short-circuits on the wafer layer 40. The outer surfaces of the fluorescent layer 20, the bonding layer 30, and the wafer layer 40 retreat along the direction D to form a slant S. The slant S can be used as a reflector with the metal circuit layer 100 and the protective film 120 coated on it, so that the light striking the slant S may have a greater chance to be reflected to the light emergent side. This will contribute in increasing the efficiency of the light-emitting diode chip, as well as in preventing the color temperature or saturation of the emergent light being affected by light leakage. Moreover, the metal circuit layer 100 can also be used as a reflector when bonded to the wafer layer 40, to further reduce the loss of light when transmitting. In an illustrated embodiment, the slant S is V-shaped, which can be easily achieved by line or linear cutting. It is understood that the slant S can also be shaped in other declining plane or surface.

In the illustrated embodiment, the wafer layer 40 can be a sapphire layer. The fluorescent layer 20 is a light conversion layer with a phosphor-mixed ratio. The monochromatic light emitted from the light-emitting diode chip of a sapphire layer can be converted into white light on passing through the fluorescent layer 20. The color temperature or saturation of the emergent light can be adjusted by changing the kinds of phosphorescent materials, or the mixing ratio of phosphorescent materials, or the thickness of the fluorescent layer 20.

The protective film 120 can be made of silicon oxide, silicon nitride, or a combination of them to form a passivation layer for protecting the metal circuit layer 100. The metal circuit layer 100 can be compounded by multi-layers of patterned metal wires.

Figure 4:
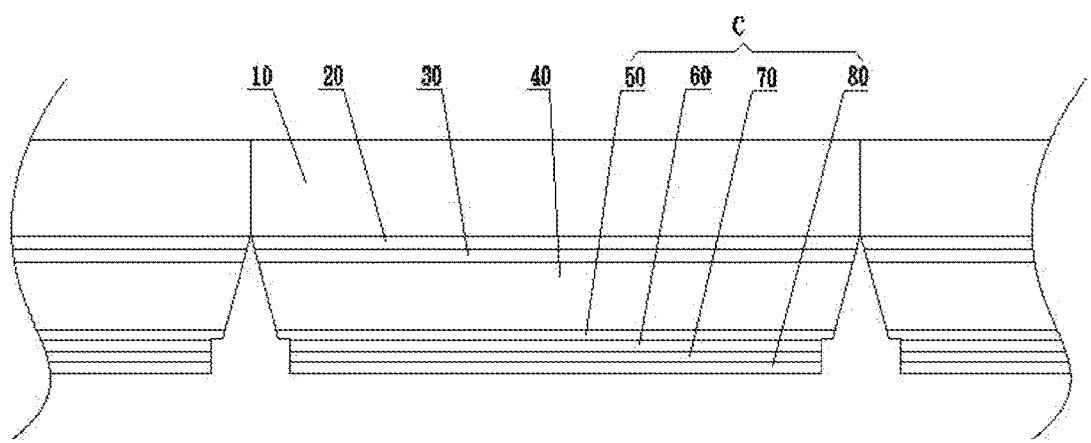
FIG. 4 is a partial schematic view of a light-emitting diode chip package of the disclosure during manufacturing.
Figure 5:
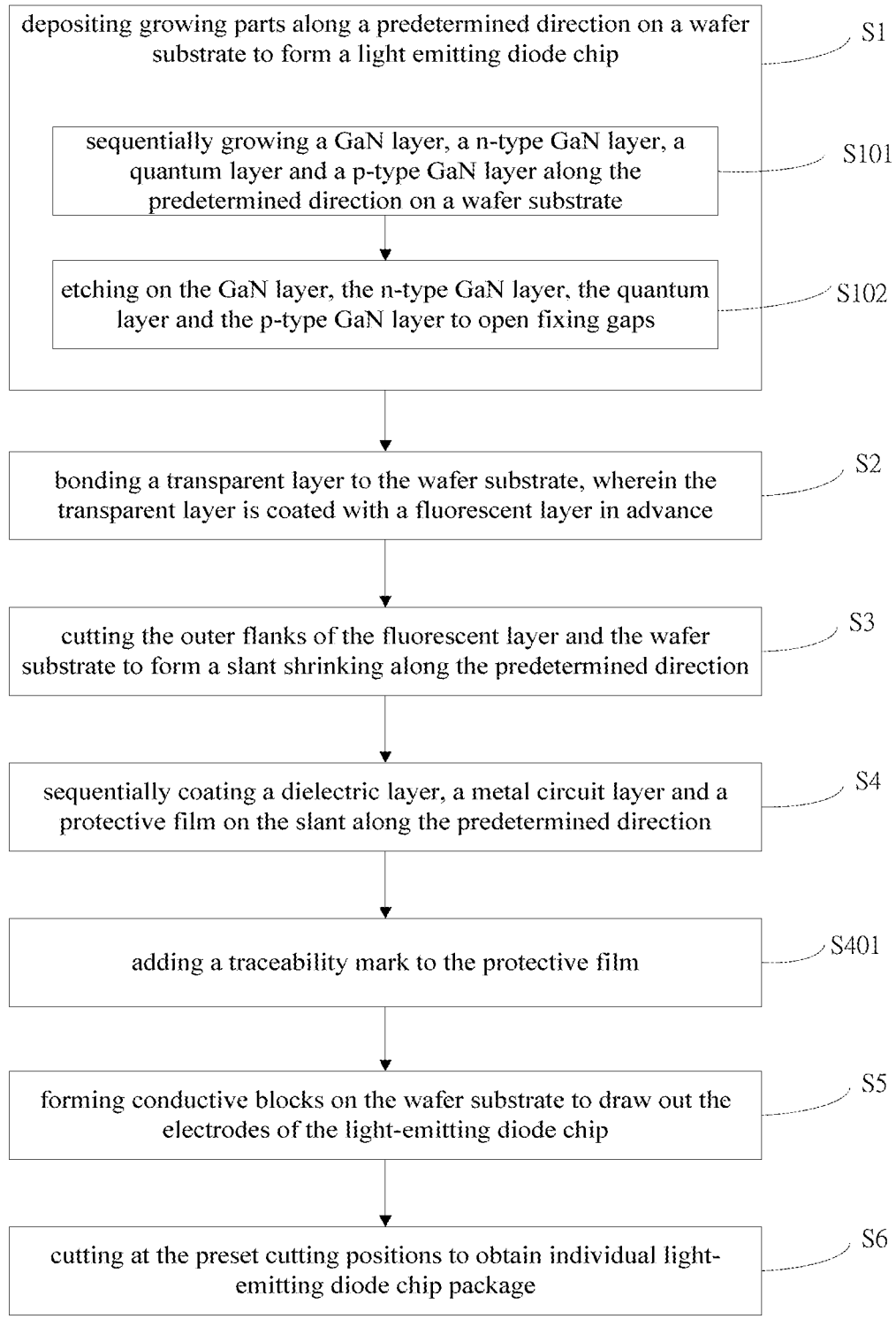
FIG. 5 schematically illustrates a process step in an embodiment for manufacturing light-emitting diode chip package of the disclosure.

As shown in FIG. 4 and FIG. 5, a method for manufacturing light-emitting diode chip packages comprises the following steps.

In step S1, growing parts are deposited along a predetermined direction on a wafer layer 40 to form a light emitting diode chip C. In an illustrated embodiment, the light-emitting diode chip C is a GaN-based light-emitting diode chip, in which case the step S1 specifically comprises step S101 and step S102 as follows.

In step S101, a GaN layer 50, an n-type GaN layer 60, a quantum layer 70, and a p-type GaN layer 80 are sequentially grown along the predetermined direction on a wafer layer 40;

In step S102, fixing gaps are opened by etching the GaN layer 50, the n-type GaN layer 60, the quantum layer 70, and the p-type GaN layer 80 to draw out the electrodes of the light-emitting diode chip C.

In step S2, a transparent layer 10 is bonded to the wafer layer 40, wherein the transparent layer 10 is precoated with a fluorescent layer 20. In an embodiment, the transparent layer 10 can be bonded to the wafer layer 40 via a bonding layer 30 disposed between them. Alignment equipment is not necessary since there is no precision alignment required in the bonding procedure. The transparent layer 10 and the wafer layer 40 may align with each other by their edges.

In step S3, outer surfaces of the fluorescent layer 20 and the wafer layer 40 are cut to form a slant S so as to retreat along the predetermined direction. The slant S may be in V-shaped, which can be easily processed by linear cutting, or the slant S may also be shaped in another declining plane or surface, as long as the light striking the slant S is reflected to the light emergent side.

In step S4, a dielectric layer 90, a metal circuit layer 100 and a protective film 120 are sequentially coated on the slant S along the predetermined direction. The slant S can be used as a reflector together with the metal circuit layer 100.

In step S5, conductive blocks 110 are formed on the wafer layer 40 to draw out the electrodes of the light-emitting diode chip C. The conductive blocks 110 may be formed by soldering or bumping process, or by gold lugs soldered to the wafer layer 40.

In an exemplary embodiment of the disclosure, the wafer layer 40 in the step S1 may be a sapphire wafer slice. Cutting positions are preset on the fluorescent layer and the wafer layer in step S3 in accordance with the required dimensions of a light-emitting diode chip package, and further step S6 after step S5 is as follows.

In step S6, individual light-emitting diode chip packages are obtained by laser cutting or blade cutting at the preset cutting positions. A fracturing procedure may also be involved after the cutting, thereby reducing the clamping processes and improving the productivity. The cutting positions and the fixing gaps can be formed at same time in the step S1.

In another exemplary embodiment of the disclosure, a step S401 is comprised between the step S4 and the step S5 as follows.

In step S401, a traceability mark may be added to the protective film 120 to confer traceability on the light-emitting diode chip packages. The traceability mark can be formed by laser printing or lithographic printing.

The embodiments shown and described above are only examples. Many details are often found in the art such as the other features of a light-emitting diode chip. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A light-emitting diode chip package, comprising:
   a transparent layer;
   a fluorescent layer;
   a wafer layer;
   a light-emitting diode chip having electrodes;
   a dielectric layer;
   a metal circuit layer;
   a protective film; and
   a plurality of conductive blocks; wherein the conductive blocks draws out the electrodes of the light-emitting diode chip;
   wherein outer surfaces of the fluorescent layer and the wafer layer are shrunk from the fluorescent layer to the wafer layer and form a slant, and
   wherein the dielectric layer, the metal circuit layer, and the protective film are expended to cover the slant, and
   wherein the light-emitting diode chip is a GaN-based light-emitting diode chip formed by a GaN layer, an n-type GaN layer, a quantum layer, and a p-type GaN layer, and the GaN layer is adjacent the n-type GaN layer.

2. The light-emitting diode chip package of claim 1, wherein the fluorescent layer is coated on the transparent layer.

3. The light-emitting diode chip package of claim 1, wherein a bonding layer is disposed between the transparent layer and the wafer layer to bond the transparent layer to the wafer layer.

4. The light-emitting diode chip package of claim 1, wherein the wafer layer is a sapphire layer, and the fluorescent layer is a light conversion layer with a phosphor mixing ratio.

5. The light-emitting diode chip package of claim 1, wherein the protective film comprises at least one of silicon oxide, silicon nitride or the mixture.

6. The light-emitting diode chip package of claim 1, wherein the metal circuit layer is compounded by multi-layers of patterned metal wires.

7. A method for manufacturing light-emitting diode chip packages, the method comprising:
   S1, depositing growing parts along a predetermined direction on a wafer layer to form a light emitting diode chip;
   S2, bonding a transparent layer to the wafer layer, wherein the transparent layer is coated with a fluorescent layer in advance;
   S3, cutting the outer surfaces of the fluorescent layer and the wafer layer to form a slant shrinking along the predetermined direction;

S4, sequentially coating a dielectric layer, a metal circuit layer and a protective film on the slant along the predetermined direction;

S5, forming conductive blocks on the wafer layer to draw out the electrodes of the light-emitting diode chip;

S401, adding a traceability mark to the protective film between the step S4 and S5.

8. The method for manufacturing light-emitting diode chip packages in claim 7, wherein the step S1 specifically comprises:

S101, sequentially growing a GaN layer, an n-type GaN layer, a quantum layer and a p-type GaN layer along the predetermined direction on a wafer layer;

S102, etching the GaN layer, the n-type GaN layer, the quantum layer and the p-type GaN layer to open fixing gaps.

9. The method for manufacturing light-emitting diode chip packages in claim 7, wherein the wafer layer in the step S1 is a sapphire wafer slice, and cutting positions are preset on the fluorescent layer and the wafer layer in the step S3 in accordance with the dimension of demand light-emitting diode chip package, and further comprises the following step after the step S5:

S6, cutting at the preset cutting positions to obtain individual light-emitting diode chip package.

* * * * *